United States Patent
Molina Mendoza et al.

(10) Patent No.: US 11,522,538 B2
(45) Date of Patent: Dec. 6, 2022

(54) BIDIRECTIONAL SWITCH FOR POWER CONTROL IN A DAISY CHAIN

(71) Applicant: Schneider Electric Industries SAS, Rueil Malmaison (FR)

(72) Inventors: Gregory Molina Mendoza, Ruelle-sur-Touvre (FR); Felipe Castillo Buenaventura, Angoulême (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 17/474,307

(22) Filed: Sep. 14, 2021

(65) Prior Publication Data

US 2022/0094355 A1   Mar. 24, 2022

(30) Foreign Application Priority Data

Sep. 18, 2020   (EP) .................................... 20306049

(51) Int. Cl.
*H03K 17/56*   (2006.01)
*H03K 17/60*   (2006.01)

(52) U.S. Cl.
CPC .................................. *H03K 17/60* (2013.01)

(58) Field of Classification Search
CPC ........ H03K 17/56; H03K 17/60; H03K 17/62; H03K 17/6221; H03K 17/6228; H03K 17/66; H03K 17/661; H03K 17/664; H03K 17/665; H03K 17/666; H03K 17/668; H03K 19/01759; H03K 19/018; H03K 19/01843
See application file for complete search history.

(56) References Cited

U.S. PATENT DOCUMENTS

| | | | |
|---|---|---|---|
| 4,186,437 A * | 1/1980 | Cuk | H03K 17/60 363/16 |
| 5,237,211 A | 8/1993 | Tanaka et al. | |
| 5,832,305 A | 11/1998 | Briggs et al. | |
| 9,900,002 B2 * | 2/2018 | Alexander | H03K 17/66 |
| 2003/0112053 A1 | 6/2003 | Reber et al. | |

FOREIGN PATENT DOCUMENTS

| | | |
|---|---|---|
| DE | 102006003157 B3 | 4/2007 |
| JP | S5121416 A | 2/1976 |
| JP | 2016062790 A | 4/2016 |

OTHER PUBLICATIONS

European Search Report and Search Opinion dated Oct. 28, 2020 for corresponding European Patent Application No. EP20306049.6, 8 pages.

* cited by examiner

*Primary Examiner* — Long Nguyen
(74) *Attorney, Agent, or Firm* — Locke Lord LLP

(57) ABSTRACT

A bidirectional bipolar transistor switch arrangement, including: a first bipolar transistor and a second bipolar transistor connected in anti-parallel between a first terminal and a second terminal, a resistor connected to the base of the first bipolar transistor and the second bipolar transistor and to a control terminal, a first diode connected with anode to the first terminal, and a second diode connected with anode to the second terminal, the first diode and the second diode being connected via respective cathodes to a supply terminal. The bidirectional bipolar transistor switch arrangement is able to control the power supply within a daisy chain with low drop voltage.

9 Claims, 2 Drawing Sheets

BIDIRECTIONAL SWITCH FOR POWER CONTROL IN A DAISY CHAIN

FIELD OF INVENTION

The present invention relates to a bidirectional transistor switch for use of power control in a daisy chain.

BACKGROUND

In electrical and electronic engineering, a daisy chain is a wiring scheme in which multiple devices are wired together in sequence or in a ring. The connection of devices within a daisy chain has some constraints of power input/output dependence between the devices. In such arrangement, it may be useful to control the power supply of the next device in a daisy chain by means of a bidirectional switch without the need of defining an input and output.

Some existing methods implement bidirectional switches but they present a significant drop of voltage across the switching device and do not address the power supply of a control device used for controlling of the power supply of a next device in the daisy chain.

There is therefore a need for controlling the power supply of the next device in a daisy chain without defining an input and output while keeping a very low voltage drop across the switching device and providing the power supply of the control device.

SUMMARY

This summary is provided to introduce concepts related to the present inventive subject matter. This summary is not intended to identify essential features of the claimed subject matter nor is it intended for use in determining or limiting the scope of the claimed subject matter.

In one implementation, there is provided a bidirectional bipolar transistor switch arrangement, comprising:
a first bipolar transistor and a second bipolar transistor connected in anti-parallel between a first terminal and a second terminal,
a resistor connected to the base of the first bipolar transistor and of the second bipolar transistor and to a control terminal,
a first diode connected with anode to the first terminal,
a second diode connected with anode to the second terminal,
the first diode and the second diode being connected via respective cathodes to a supply terminal.

Advantageously, by using an arrangement of bipolar PNP transistors along with two diodes, a bidirectional solid-state switch is obtained exhibiting very low voltage drop while providing the power supply to the control device. Only a single control signal can thus be used to drive the bidirectional switch.

In an embodiment, an input voltage is provided at one of the first terminal and the second terminal and an output voltage is provided at the other one of the first terminal and the second terminal.

In an embodiment, when zero current is caused to flow from the control terminal, said first bipolar transistor and said second bipolar transistor are in off state.

In an embodiment, when positive current is caused to flow from the control terminal, one of the first bipolar transistor and the second bipolar transistor is in saturated state and the other of the first bipolar transistor and the second bipolar transistor is in reverse state.

In an embodiment, said first bipolar transistor and said second bipolar transistor are of the PNP type.

In an embodiment, the first diode and the second diode are low drop voltage diodes.

In an embodiment, the resistor is calibrated as a function of the maximum current to allow through said first bipolar transistor and said second bipolar transistor.

In an embodiment, the first terminal and the second terminal are linked to electronic devices in a daisy chain.

In an embodiment, the control terminal and the supply terminal are linked to a control device that is able to set the current flowing from the control terminal.

BRIEF DESCRIPTION OF THE FIGURES

The detailed description is described with reference to the accompanying figures. In the figures, the left-most digit(s) of a reference number identifies the figure in which the reference number first appears. The same numbers are used throughout the figures to reference like features and components. Some embodiments of system and/or methods in accordance with embodiments of the present subject matter are now described, by way of example only, and with reference to the accompanying figures, in which.

The same reference number represents the same element or the same type of element on all drawings.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

DESCRIPTION OF EMBODIMENTS

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention, and are to be construed as being without limitation to such specifically recited examples and conditions. As a result, the invention is not limited to the specific embodiments or examples described below, but by the claims and their equivalents.

Figure 1:
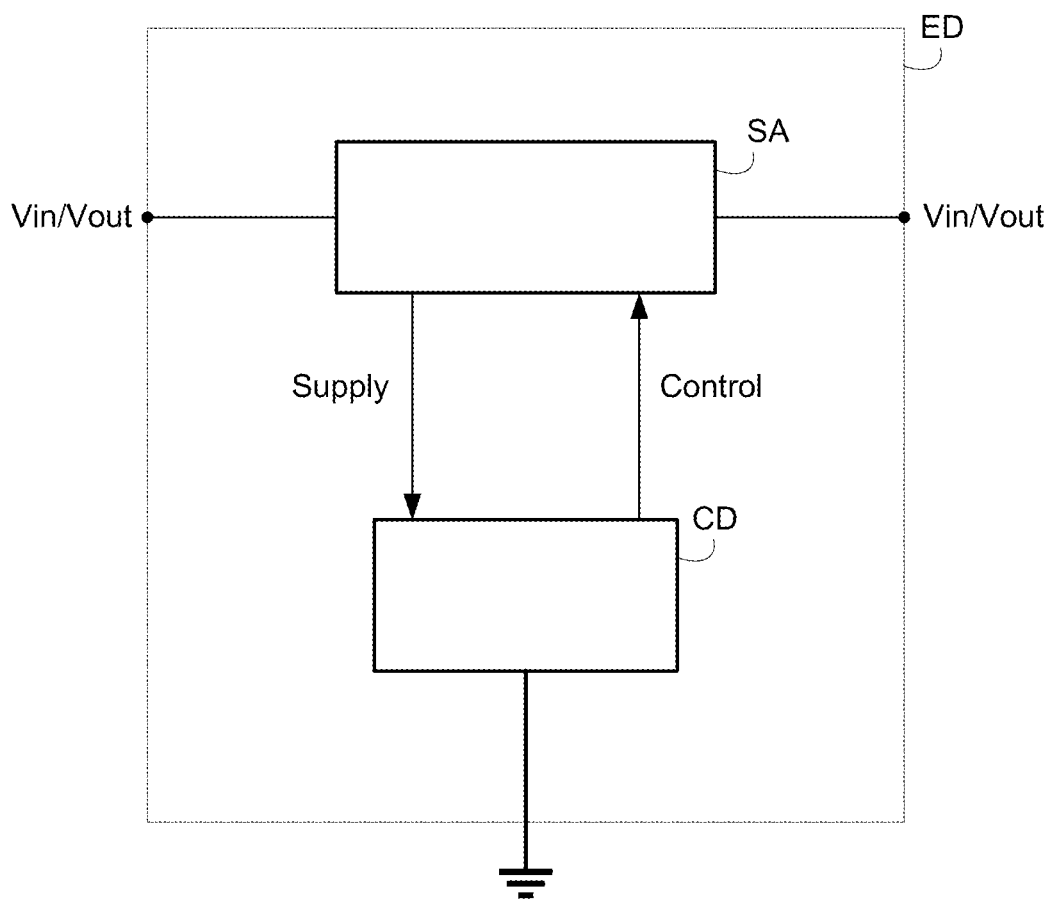
FIG. 1 shows a functional block diagram of an electronic device in a daisy chain in accordance with one embodiment of the invention.

Referring to FIG. 1, an electronic device ED comprises a switch arrangement SA and a control device CD connected to the ground. The electronic device ED is connected in a daisy chain to a previous electronic device where an input voltage Vin comes from and to a next electronic device by supplying the latter by an output voltage Vout.

The control device CD controls the output voltage Vout through the control signal Control directed to the switch arrangement, by enabling or disabling said control signal Control. Thus the output voltage Vout to supply the next electronic device in the daisy chain can be turn on or off by the control device by respectively enabling or disabling the control signal Control. The control device CD may include a microprocessor and a memory comprising program instructions stored thereon for performing the control of the output voltage.

Figure 2:
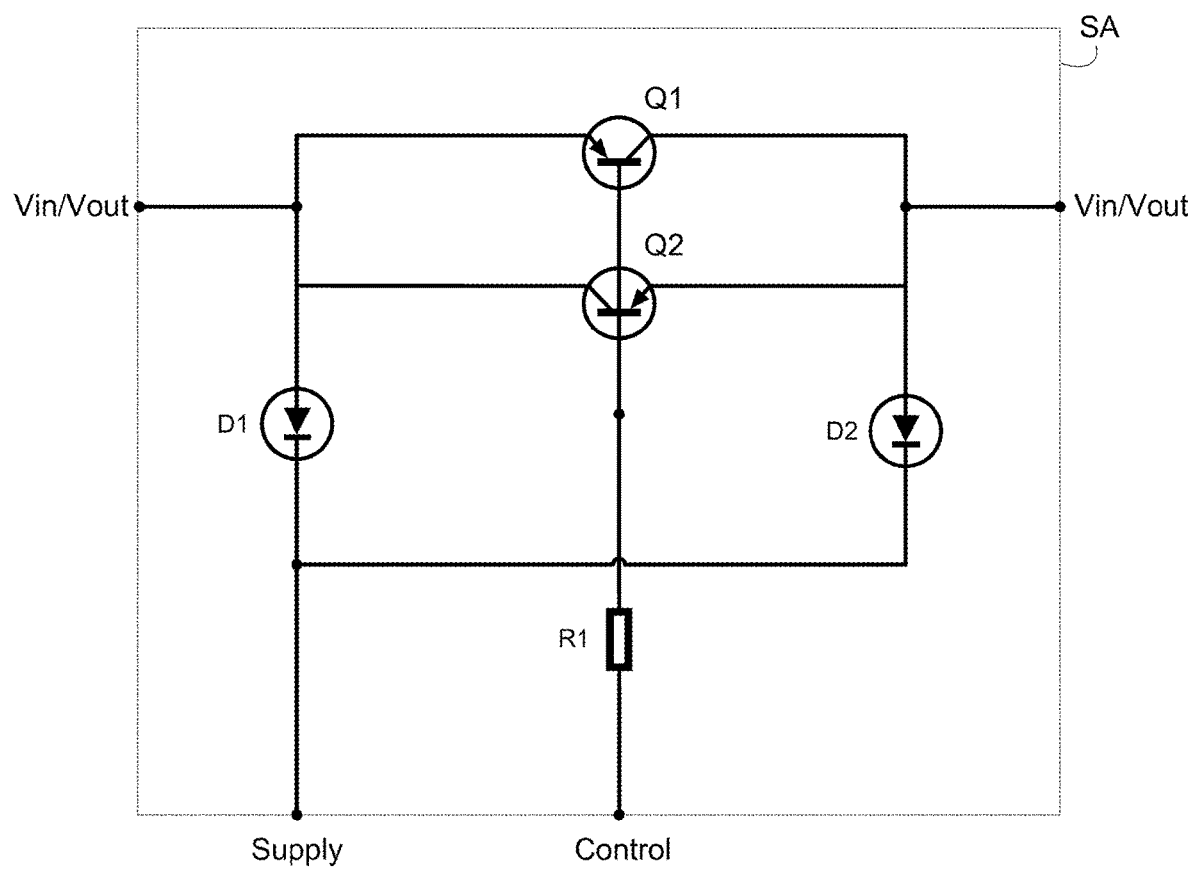
FIG. 2 shows a schematic circuit diagram of the switch arrangement in accordance with one embodiment of the invention.

The switch arrangement SA comprises a bidirectional switch with power arbitration circuitry to supply the control device CD, the configuration therein being explained in detail in FIG. 2.

The control device CD is supplied by a supply signal Supply provided by the switch arrangement independently from where the input voltage Vin comes from. Thus the control device is supplied independently of the state of the switch arrangement and the direction of the current through the switch arrangement.

The electronic device requires only one signal Control to pilot the power supply of the next electronic device in the daisy chain via the output voltage Vout.

Referring to FIG. 2 is depicted in more details the circuit inside the switch arrangement SA.

The switch arrangement SA comprises two PNP bipolar transistors Q1 and Q2 with low saturation voltage, two diodes D1 and D2 with low drop voltage and a resistor R1.

As is conventional, a PNP bipolar transistor Q1 or Q2 is made up of regions of semi-conductor material, in which conduction takes place by the movement of particles of negative (N) and positive (P) conductivity types, in which normal direction of current flow is from the emitter to the collector.

As is conventional, a diode D1 or D2 is a diode wherein the current can only flow from the anode to the cathode through the diode.

The two PNP bipolar transistors Q1 and Q2 are connected in anti-parallel between a first terminal and a second terminal, wherein an input voltage is provided at one of the first terminal and the second terminal and an output voltage is provided at the other one of the first terminal and the second terminal.

The base of the two PNP bipolar transistors Q1 and Q2 is connected across the resistor R1 to a control terminal. The control terminal is linked to the control device from which the control signal Control is provided.

The first diode D1 is connected with anode to the first terminal and the second diode D2 is connected with anode to the second terminal.

The first diode D1 and the second diode D2 are connected via their respective cathodes to a supply terminal. The supply terminal is linked to the control device to which the supply signal Supply is provided.

In one embodiment, the control terminal can logically be set to "0" or "1", in order to control the state of the switch arrangement.

When the control terminal is set to "1" (logic high), the current from the signal Control flowing to the base of the PNP bipolar transistors Q1 and Q2 is zero. Thus both PNP bipolar transistors Q1 and Q2 operate as open switches and are in off state and no current can circulate through the transistors allowing to turn off the next device in the daisy chain. Independently of the state of the signal Control, the power supply for the control device is provided through the diodes D1 and D2 depending on which side the power supply has been attached, i.e. on which of the first terminal and the second terminal the power supply is provided. The purpose of these diodes is to supply the control device independently of the state of the signal Control while avoiding current leakage towards the output voltage terminal.

When the control terminal is set to "0" (logic low), the current from the signal Control flowing to the base of the PNP bipolar transistors Q1 and Q2 is positive and can be set as maximal according to the calibration of the resistor R1. Thus either PNP bipolar transistor Q1 or Q2 is saturated depending on which side of the block the power supply is set. The current can only flow from left to right in PNP bipolar transistor Q1 and right to left in PNP bipolar transistor Q2. When the signal PNP bipolar transistors is set to "0", one transistor operates as a closed switch and is in saturated state while the other transistor is in reverse state.

The advantage of operating with bipolar transistors is that when polarized inversely in off state there is no current flow which is not the case when operating with transistors of type MOSFET. Besides this essential advantage, the bipolar transistors can exhibit very low saturation voltage which is at the end of the daisy chain.

Although the present invention has been described above with reference to specific embodiments, it is not intended to be limited to the specific form set forth herein. Rather, the invention is limited only by the accompanying claims and, other embodiments than the specific above are equally possible within the scope of these appended claims.

Furthermore, although exemplary embodiments have been described above in some exemplary combination of components and/or functions, it should be appreciated that, alternative embodiments may be provided by different combinations of members and/or functions without departing from the scope of the present disclosure. In addition, it is specifically contemplated that a particular feature described, either individually or as part of an embodiment, can be combined with other individually described features, or parts of other embodiments

The invention claimed is:

1. A bidirectional bipolar transistor switch arrangement, comprising:
   a first bipolar transistor and a second bipolar transistor connected in anti-parallel between a first terminal and a second terminal,
   a resistor connected to the base of the first bipolar transistor and of the second bipolar transistor and to a control terminal,
   a first diode connected with anode to the first terminal,
   a second diode connected with anode to the second terminal,
   the first diode and the second diode being connected via respective cathodes to a supply terminal.

2. The bidirectional bipolar transistor switch arrangement according to claim 1, wherein an input voltage is provided at one of the first terminal and the second terminal and an output voltage is provided at the other one of the first terminal and the second terminal.

3. The bidirectional bipolar transistor switch arrangement according to claim 1, wherein when zero current is caused to flow from the control terminal, said first bipolar transistor and said second bipolar transistor are in off state.

4. The bidirectional bipolar transistor switch arrangement according to claim 1, wherein when positive current is caused to flow from the control terminal, one of the first bipolar transistor and the second bipolar transistor is in saturated state and the other of the first bipolar transistor and the second bipolar transistor is in reverse state.

5. The bidirectional bipolar transistor switch arrangement according to claim 1, wherein said first bipolar transistor and said second bipolar transistor are of the PNP type.

6. The bidirectional bipolar transistor switch arrangement according to claim 1, wherein the first diode and the second diode are low drop voltage diodes.

7. The bidirectional bipolar transistor switch arrangement according to claim 1, wherein the resistor is calibrated as a function of the maximum current to allow through said first bipolar transistor and said second bipolar transistor.

8. The bidirectional bipolar transistor switch arrangement according to claim 1, wherein the first terminal and the second terminal are linked to electronic devices in a daisy chain.

9. The bidirectional bipolar transistor switch arrangement according to claim 1, wherein the control terminal and the supply terminal are linked to a control device that is able to set the current flowing from the control terminal.

* * * * *